United States Patent
Nakazawa et al.

(10) Patent No.: US 12,496,622 B2
(45) Date of Patent: Dec. 16, 2025

(54) SUBSTRATE PROCESSING APPARATUS

(71) Applicant: SCREEN Holdings Co., Ltd., Kyoto (JP)

(72) Inventors: Kazuhiko Nakazawa, Kyoto (JP); Toshihito Morioka, Kyoto (JP); Hiromichi Kaba, Kyoto (JP); Takashi Ota, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 431 days.

(21) Appl. No.: 18/188,976

(22) Filed: Mar. 23, 2023

(65) Prior Publication Data
US 2023/0302501 A1   Sep. 28, 2023

(30) Foreign Application Priority Data

Mar. 24, 2022   (JP) .................................. 2022-047869

(51) Int. Cl.
*B08B 3/02*   (2006.01)
*B08B 3/04*   (2006.01)
(Continued)

(52) U.S. Cl.
CPC .................. *B08B 3/02* (2013.01); *B08B 3/04* (2013.01); *B08B 5/02* (2013.01); *B08B 11/02* (2013.01); *B08B 13/00* (2013.01)

(58) Field of Classification Search
CPC .... B08B 3/02; B08B 3/04; B08B 5/02; B08B 11/02; B08B 13/00; H01L 21/68735;
(Continued)

(56) References Cited

U.S. PATENT DOCUMENTS 4,903,717 A * 2/1990 Sumnitsch .......... H01L 21/6708
269/21
5,492,566 A * 2/1996 Sumnitsch .......... H01L 21/6715
269/21
(Continued)

FOREIGN PATENT DOCUMENTS

CN   112542419 A   3/2021
JP   2006-49598 A   2/2006
(Continued)

OTHER PUBLICATIONS

Office Action issued Feb. 20, 2024 in corresponding Taiwanese Patent Application No. 112110599.
(Continued)

*Primary Examiner* — Monica S Carter
*Assistant Examiner* — Caleb Andrew Holizna
(74) *Attorney, Agent, or Firm* — OSTROLENK FABER LLP

(57) ABSTRACT

A substrate processing apparatus delivers a gas between a lower surface of a substrate and a base surface of a base part to form an airflow flowing radially outward and to cause a pressure drop in a space between the substrate and the base part by the Bernoulli effect. The base surface includes a second surface sloping upward in a radially outward direction. A third surface slopes downward in a radially outward direction from the outer peripheral edge of the second surface. A fourth surface is an annular surface contiguous to the lower edge of the third surface. The fourth surface expands radially outward outside the outer peripheral edge of the substrate in the radial direction. Accordingly, it is possible to suppress adhesion of a processing liquid to the lower surface of the substrate and to improve the stability of holding the substrate.

10 Claims, 10 Drawing Sheets

(51) Int. Cl.
*B08B 5/02* (2006.01)
*B08B 11/02* (2006.01)
*B08B 13/00* (2006.01)

(58) Field of Classification Search
CPC ........... H01L 21/67051; H01L 21/6708; H01L 21/6838; H01L 21/6875; H01L 21/67017
USPC .......................................................... 15/320
See application file for complete search history.

(56) References Cited

U.S. PATENT DOCUMENTS

| | | | |
|---|---|---|---|
| 5,896,877 A * | 4/1999 | Pirker | H01L 21/68735 134/902 |
| 11,085,112 B2 | 8/2021 | Hawkins et al. | |
| 2006/0027323 A1 | 2/2006 | Miya et al. | 156/345.23 |
| 2008/0066865 A1 | 3/2008 | Langen | 156/345.33 |
| 2015/0240357 A1 | 8/2015 | Tachibana et al. | |
| 2017/0278727 A1 | 9/2017 | Mouri et al. | |
| 2021/0086236 A1 | 3/2021 | Nakazawa et al. | |

FOREIGN PATENT DOCUMENTS

| | | |
|---|---|---|
| JP | 2007-335587 A | 12/2007 |
| JP | 2009142818 A | 7/2009 |
| JP | 2015-159248 A | 9/2015 |
| JP | 2022-34285 A | 3/2022 |
| WO | WO 2012/164454 A1 | 12/2012 |
| WO | WO 2014/082196 A1 | 6/2014 |

OTHER PUBLICATIONS

Extended European Search Report dated Jul. 19, 2023 issued in corresponding European Patent Application No. 23162985.8.
Decision to Grant a Patent for corresponding Japanese Patent Application No. 2022-047869 issued on Aug. 18, 2025, with English translation attached.

* cited by examiner

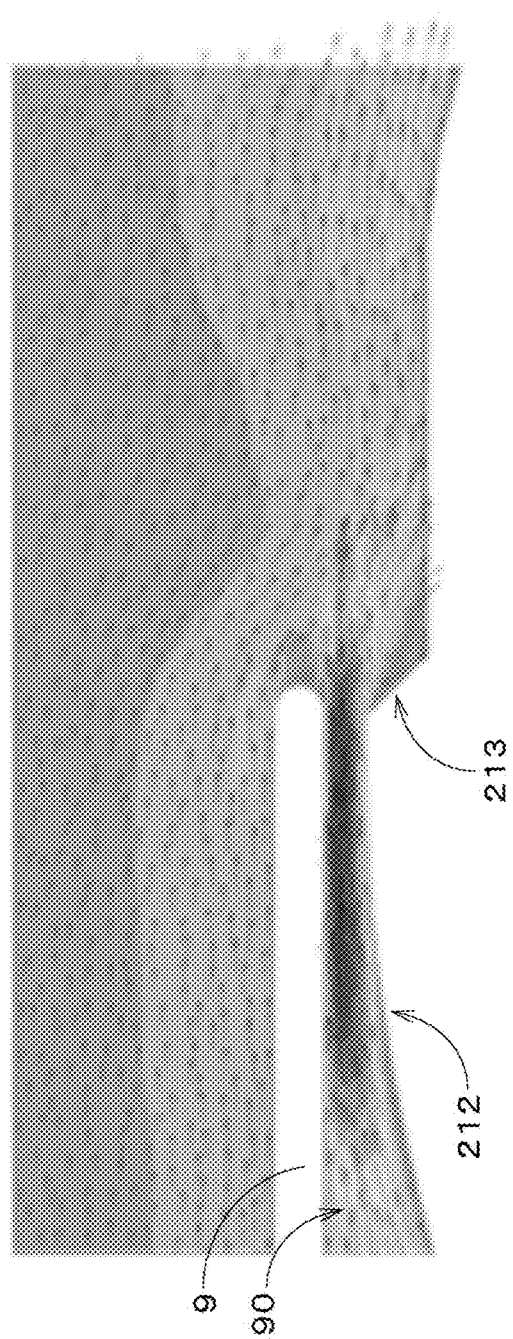

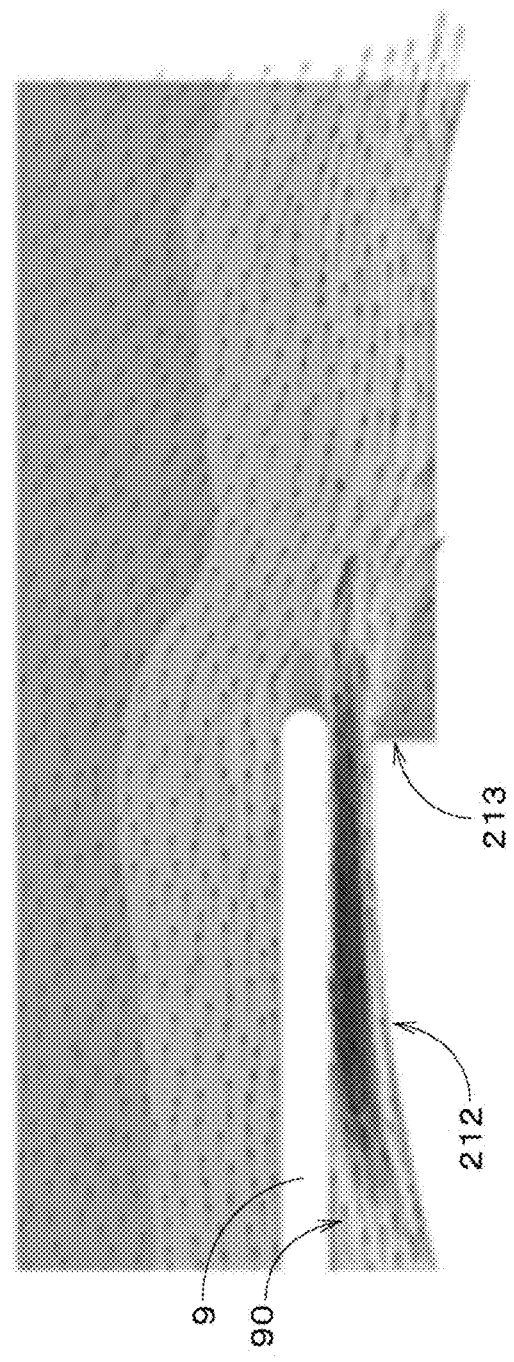

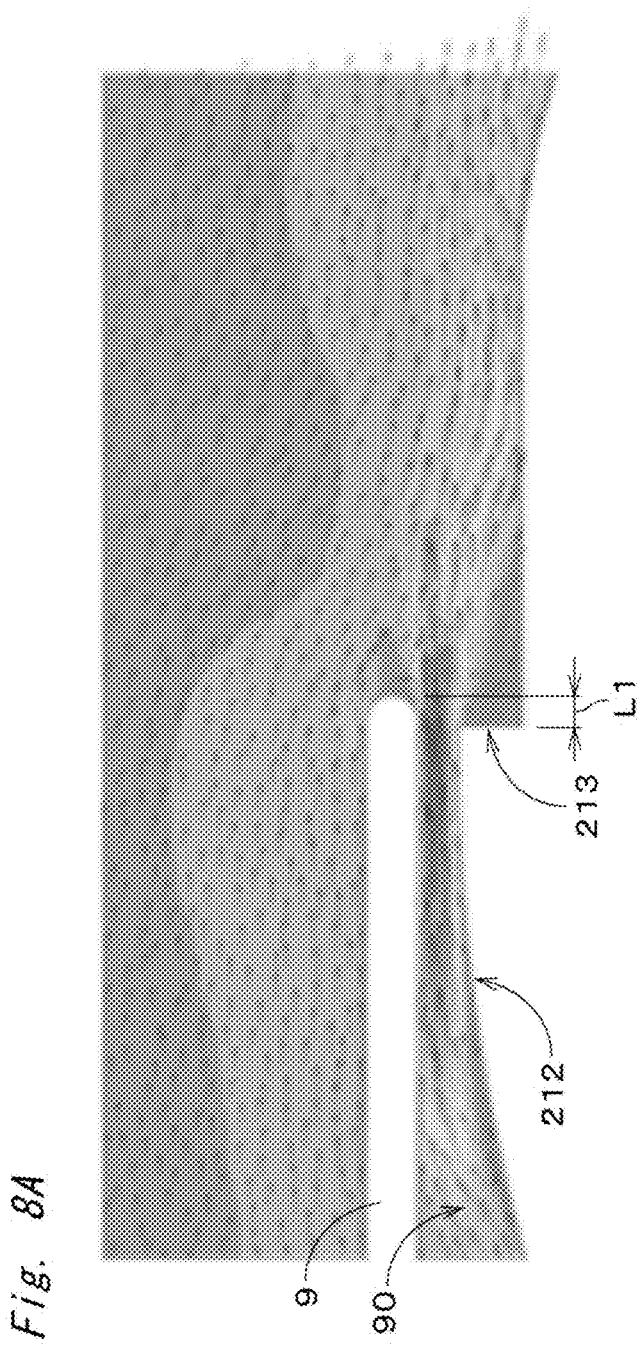

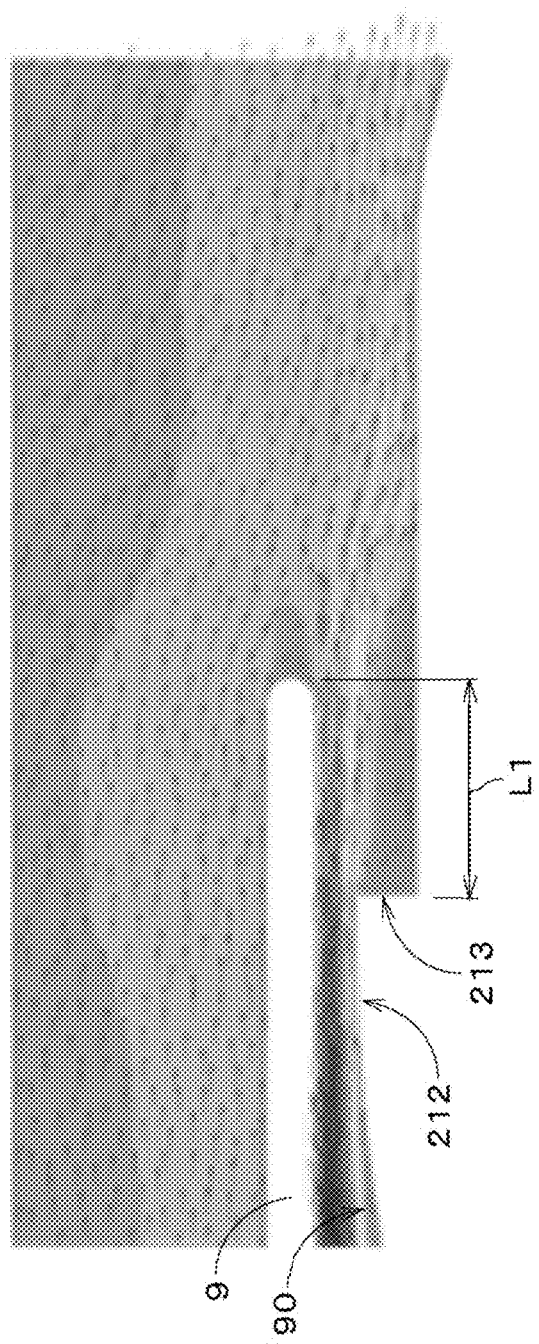

SUBSTRATE PROCESSING APPARATUS

CROSS-REFERENCE TO RELATED APPLICATIONS

This application claims priority benefit of Japanese Patent Application No. JP2022-047869 filed in the Japan Patent Office on Mar. 24, 2022, the entire disclosure of which is incorporated herein by reference.

TECHNICAL FIELD

The present invention relates to a substrate processing apparatus for processing substrates.

BACKGROUND ART

A conventional process of manufacturing semiconductor substrates (hereinafter, simply referred to as "substrates") involves various types of processing to be performed on the substrates. For example, liquid processing is performed on the substrates by rotating each substrate held in a horizontal position by a substrate holder and supplying a processing liquid to the surface of the rotating substrate.

Wet etching equipment disclosed in Japanese Patent Application Laid-Open No. 2009-142818 (Document 1) uses a Bernoulli chuck as a substrate holder for holding substrates, the Bernoulli chuck supplying a high-pressure gas to a space between a substrate and a support located below the substrate and sucking the substrate toward the support using a negative pressure generated by the gas flowing along the lower surface of the substrate. This gas is supplied to the space between the substrate and the support from an annular nozzle provided on the upper surface of the support below the outer peripheral portion of the substrate. The support has an annular gas exhaust portion that is spaced below from the substrate and that expands radially outward of the outer peripheral edge of the substrate from the annular nozzle. Below the gas exhaust portion, an annular gas exhaust passage is provided that extends radially outward and downward from the aforementioned annular nozzle.

In this wet etching equipment, an etchant supplied to the upper surface of the substrate flows around from the outer peripheral edge of the substrate to the lower surface of the substrate and fills clearance between the peripheral edge portion of the lower surface of the substrate and the gas exhaust portion of the support. This results in etching of the peripheral edge portion of the lower surface of the substrate. The etchant flowing around to the lower surface of the substrate is discharged radially outward through the gas exhaust passage. The gas supplied from the annular nozzle to the space between the substrate and the support is also discharged radially outward through the gas exhaust passage.

Unlike the etching described in Document 1, the liquid processing to be performed on each substrate may sometimes be required to prevent the processing liquid supplied to the upper surface of the substrate from flowing around to the lower surface of the substrate. However, in the case where the substrate is held by the Bernoulli chuck as described in Document 1, the processing liquid or the like that is supplied to the upper surface of the substrate and flows downward from the outer peripheral edge of the substrate may be drawn by suction under the negative pressure generated between the substrate and the support and may flow around to the lower surface of the substrate.

Meanwhile, if the flowing-around of the processing liquid to the lower surface of the substrate is tried to be prevented by increasing the flow rate of the gas supplied to the space between the substrate and the support, the substrate may be pushed upward by the gas and this may deteriorate the stability of holding the substrate by the Bernoulli chuck.

SUMMARY OF THE INVENTION

The present invention is intended for a substrate processing apparatus for processing substrates, and it is an object of the present invention to improve the stability of holding a substrate while suppressing adhesion of a processing liquid to the lower surface of the substrate.

A substrate processing apparatus according to one preferable embodiment of the present invention includes a substrate holder that holds a substrate in a horizontal position, a substrate rotation mechanism that rotates the substrate holder about a central axis pointing in an up-down direction, and a processing-liquid supplier that supplies a processing liquid to an upper surface of the substrate. The substrate holder includes a base part having a base surface that faces a lower surface of the substrate and that extends radially outward of an outer peripheral edge of the substrate, a plurality of support pins that are aligned in a circumferential direction on the base surface and that project upward from the base surface to come in contact with an outer peripheral portion of the lower surface of the substrate, and a gas supplier that delivers a gas between the lower surface of the substrate and the base surface of the base part to form an airflow flowing radially outward and to cause a pressure drop in a space between the substrate and the base part by a Bernoulli effect. The base surface includes a first surface that is a circular horizontal surface facing a central portion of the substrate in the up-down direction, a second surface that is an annular surface expanding radially outward from an outer peripheral edge of the first surface below the substrate, the second surface sloping upward in a radially outward direction and having the plurality of support pins arranged thereon, a third surface that is an annular surface contiguous to an outer peripheral edge of the second surface below the lower surface of the substrate, the third surface expanding vertically downward from the outer peripheral edge of the second surface or sloping downward in a radially outward direction, and a fourth surface that is an annular surface contiguous to a lower edge of the third surface, the fourth surface expanding radially outward outside the outer peripheral edge of the substrate in a radial direction. The gas supplier includes a circumferential gas delivery port that is provided on the first surface or on a boundary between the first surface and the second surface to deliver a gas in a radially outward direction.

The substrate processing apparatus described above is capable of improving the stability of holding the substrate while suppressing adhesion of the processing liquid to the lower surface of the substrate.

Preferably, the fourth surface may expand at the same level in the up-down direction as the lower edge of the third surface or slope downward in a radially outward direction from the lower edge of the third surface.

Preferably, the base surface may further include an annular fifth surface that slopes downward in a radially outward direction from an outer peripheral edge of the fourth surface.

Preferably, the third surface may be a curved surface that slopes downward in a radially outward direction from the outer peripheral edge of the second surface and that is convex radially outward and upward.

Preferably, the third surface may be contiguous to the outer peripheral edge of the second surface below the substrate.

Preferably, a distance in a radial direction between the outer peripheral edge of the substrate and a boundary between the second surface and the third surface may be greater than or equal to 0.5 mm and less than or equal to 2.0 mm.

Preferably, a distance in the up-down direction between the lower surface of the substrate and a boundary between the second surface and the third surface may be greater than or equal to 0.6 mm and less than or equal to 1.0 mm.

Preferably, the second surface may an inclined surface that slopes radially outward and upward at a predetermined inclination angle from the outer peripheral edge of the first surface, and the predetermined inclination angle of the second surface may be less than or equal to 15 degrees.

Preferably, the second surface may have a radial length of 10 mm or more.

Preferably, a distance in the up-down direction between the first surface and the lower surface of the substrate may be greater than or equal to 0.6 mm and less than or equal to 1.5 mm.

These and other objects, features, aspects and advantages of the present invention will become more apparent from the following detailed description of the present invention when taken in conjunction with the accompanying drawings.

BRIEF DESCRIPTION OF DRAWINGS

FIG. 7B is a diagram showing the flow of gas in the vicinity of the outer peripheral portion of the substrate;

FIG. 7C is a diagram showing the flow of gas in the vicinity of the outer peripheral portion of the substrate;

FIG. 8A is a diagram showing the flow of gas in the vicinity of the outer peripheral portion of the substrate;

FIG. 8B is a diagram showing the flow of gas in the vicinity of the outer peripheral portion of the substrate.

DETAILED DESCRIPTION

Figure 1:
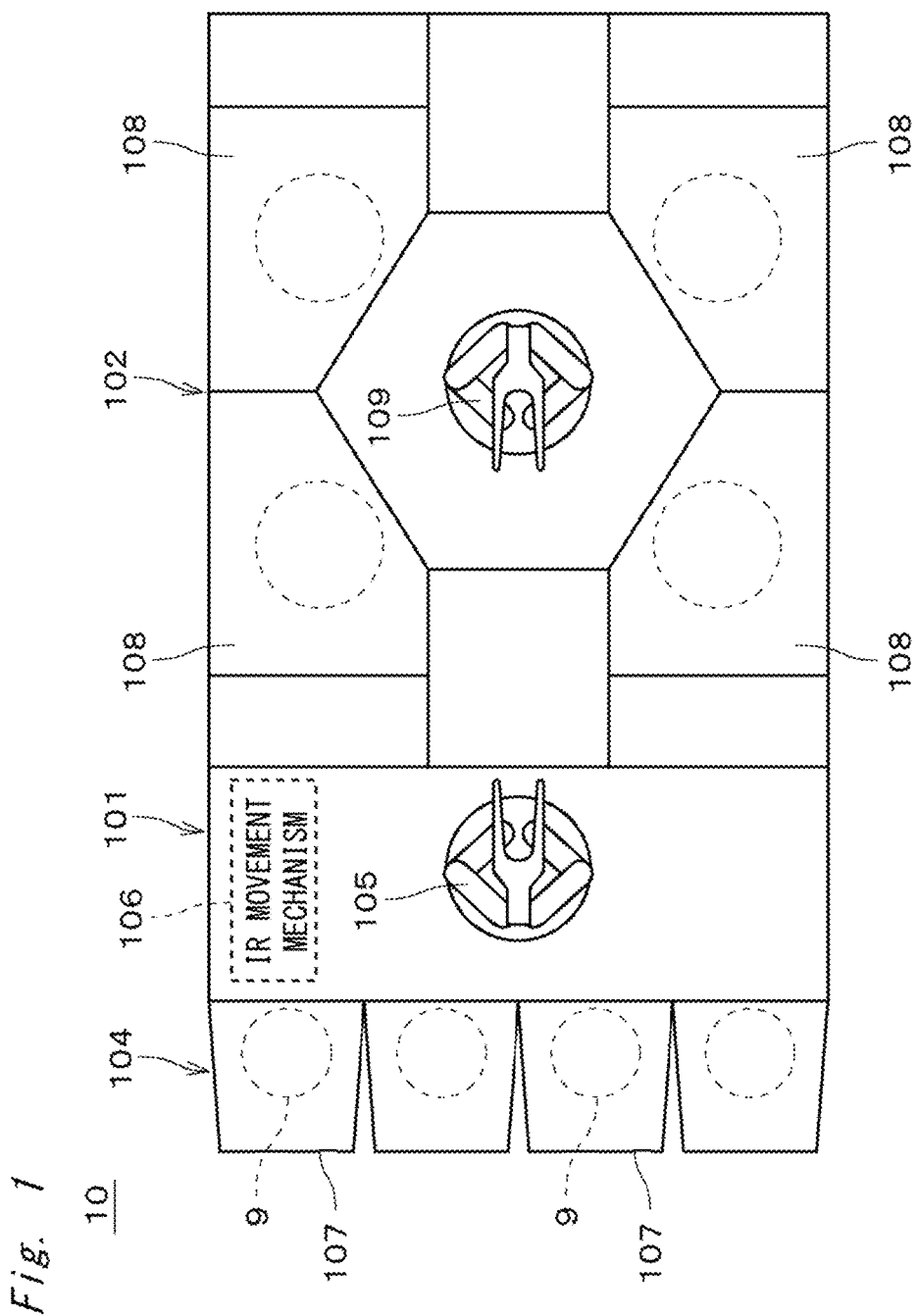
FIG. 1 is a plan view of a substrate processing system according to one embodiment.

FIG. 1 is a diagrammatic plan view illustrating the layout of a substrate processing system 10 that includes a substrate processing apparatus according to one embodiment of the present invention. The substrate processing system 10 is a system for processing semiconductor substrates 9 (hereinafter, simply referred to as "substrates 9"). The substrate processing system 10 includes an indexer block 101 and a processing block 102 that is coupled to the indexer block 101.

The indexer block 101 includes a carrier holder 104, an indexer robot 105, and an IR movement mechanism 106. The carrier holder 104 holds a plurality of carriers 107 that are each capable of housing a plurality of substrates 9. The carriers 107 (e.g., FOUPs) are held by the carrier holder 104 while being arranged in a predetermined carrier arrangement direction. The IR movement mechanism 106 moves the indexer robot 105 in the carrier arrangement direction. The indexer robot 105 performs an export operation of carrying substrates 9 out of the carriers 107 and an import operation of carrying substrates 9 into the carriers 107 held by the carrier holder 104. The substrates 9 are transported in a horizontal position by the indexer robot 105.

The processing block 102 includes a center robot 109 and a plurality of (e.g., four or more) processing units 108 that process substrates 9. The processing units 108 are arranged so as to surround the center robot 109 in plan view. The processing units 108 perform various types of processing on the substrates 9. The substrate processing apparatus, which will be described later, is one of the processing units 108. The center robot 109 performs an import operation of carrying the substrates 9 into the processing units 108 and an export operation of carrying the substrates 9 out of the processing units 108. The center robot 109 further transports the substrates 9 among the processing units 108. The substrates 9 are transported in a horizontal position by the center robot 109. The center robot 109 receives the substrates 9 from the indexer robot 105 and transfers the substrates 9 to the indexer robot 105.

Figure 2:
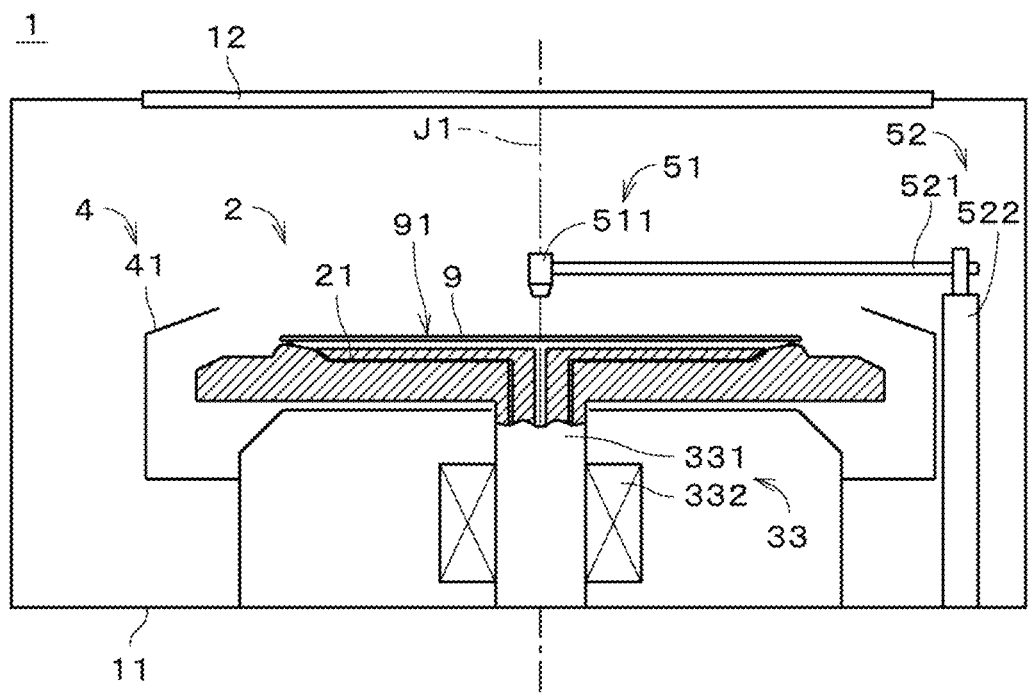
FIG. 2 is a side view of a configuration of a substrate processing apparatus.

FIG. 2 is a side view of a configuration of a substrate processing apparatus 1. In FIG. 2, part of the configuration of the substrate processing apparatus 1 is shown in section. The substrate processing apparatus 1 is a single wafer processing apparatus that processes the substrates 9 one by one. The substrate processing apparatus 1 performs liquid processing on the substrates 9 by supplying a processing liquid. The liquid processing may involve, for example, removing foreign materials adhering to the substrates 9 (i.e., cleaning) during processing that is performed prior to the operation of carrying the substrates 9 into the substrate processing apparatus 1. Examples of the foreign materials may include residues that remain on the surfaces of the substrates 9 during grinding processing performed on the substrates 9. In the following description, the upper and lower sides in FIG. 2 are also simply referred to as the "upper and lower sides."

The substrate processing apparatus 1 includes a substrate holder 2, a substrate rotation mechanism 33, a cup part 4, a processing-liquid supplier 51, a processing-part movement mechanism 52, and a chamber 11. The substrate holder 2, the substrate rotation mechanism 33, the cup part 4, the processing-liquid supplier 51, and so on are housed in the internal space of the chamber 11. At the canopy portion of the chamber 11, an airflow former 12 is provided that supplies a gas to the aforementioned internal space to form an airflow flowing downward (a so-called downflow). One example of the airflow former 12 may be a fan filter unit (FFU). Note that the airflow former 12 may be other than the FFU in the substrate processing apparatus 1.

The substrate holder 2 and the substrate rotation mechanism 33 each form part of a spin chuck that holds and rotates an approximately disk-like substrate 9. The substrate holder 2 holds a substrate 9 in a horizontal position from the underside. The substrate holder 2 may be a Bernoulli chuck that adsorbs and holds a substrate 9 by the Bernoulli effect. The substrate 9 may, for example, be an approximately disk-like substrate with a diameter of 300 mm.

Figure 3:
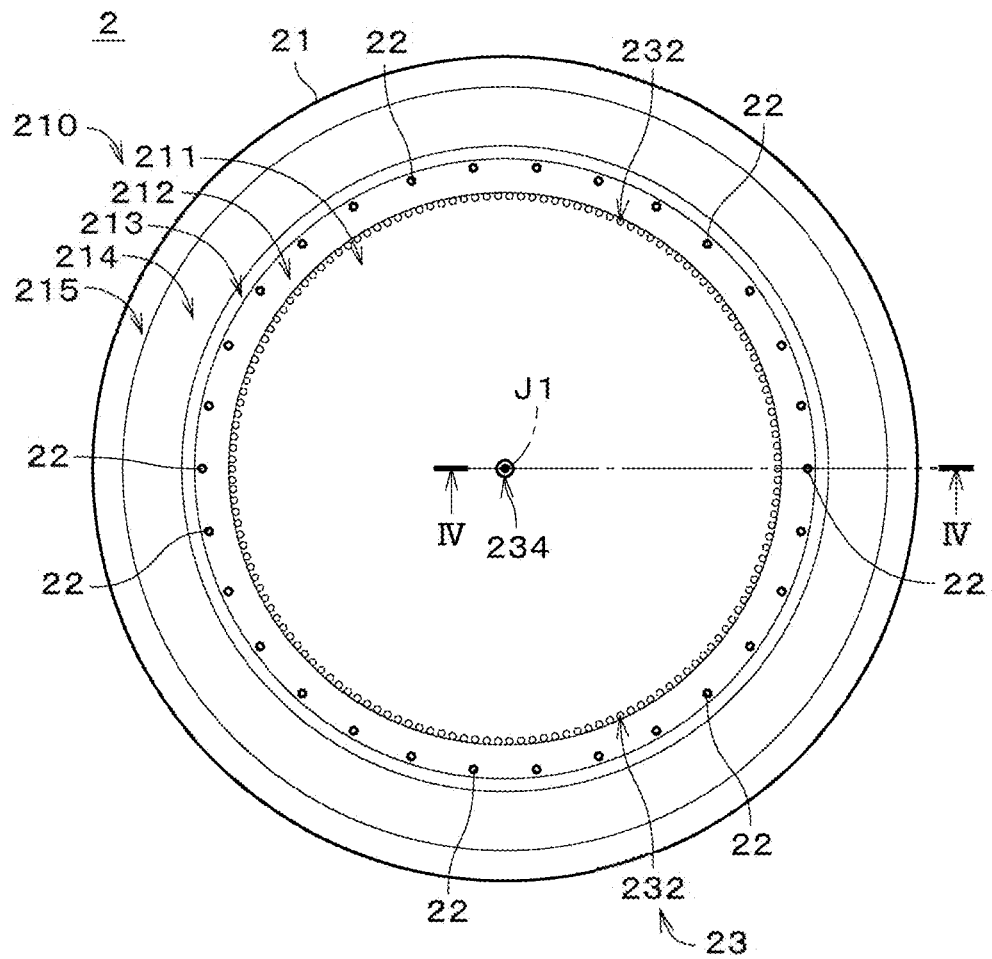
FIG. 3 is a plan view of a substrate holder.
Figure 4:
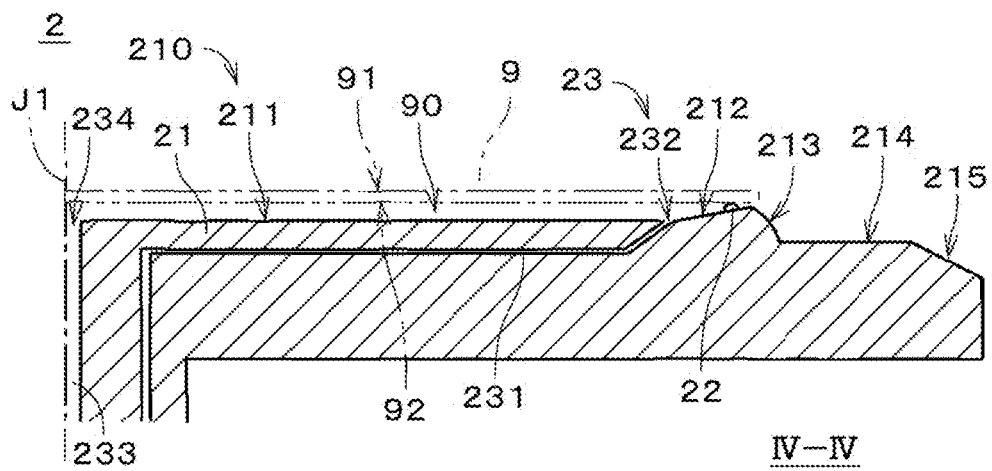
FIG. 4 is a sectional view illustrating part of the substrate holder.

FIG. 3 is a plan view of the substrate holder 2. FIG. 4 is a sectional view of the substrate holder 2 taken along at position Iv-Iv in FIG. 3. In FIG. 4, the substrate 9 held by the substrate holder 2 is indicated by the chain double-dashed line. As illustrated in FIGS. 3 and 4, the substrate holder 2 includes a base part 21, a plurality of support pins 22, and a gas supplier 23.

The base part 21 is an approximately disk-like member centered on a central axis J1 pointing in the up-down direction. The substrate 9 is arranged above the base part 21 while being spaced from the base part 21. The base part 21 has an upper main surface 210 (hereinafter, also referred to as the "base surface 210") facing a lower surface 92 of the substrate 9 in the up-down direction at a position spaced below from a lower main surface of the substrate 9 (hereinafter, also referred to as the "lower surface 92"). The base part 21 has a diameter greater than the diameter of the substrate 9, and the base surface 210 extends radially outward of the outer peripheral edge of the substrate 9 along the entire circumference.

The support pins 22 are arranged in a circumferential direction about the central axis J1 (hereinafter, also simply referred to as the "circumferential direction") while being spaced from one another on the base surface 210 of the base part 21. The support pins 22 are arranged on the same circumference about the central axis J1. For example, the support pins 22 may be arranged at approximately equiangular intervals in the circumferential direction. In the example illustrated in FIG. 3, the number of support pins 22 is 30. The support pins 22 are projections that project upward from the base surface 210. Each support pin 22 may have, for example, an approximately hemispherical shape. The support pins 22 are fixed to the base part 21 and do not move relative to the base part 21. The substrate holder 2 holds the substrate 9 in an approximately horizontal position without contact with the central portion of the lower surface 92 of the substrate 9, by bringing the support pins 22 into contact with the outer peripheral portion of the lower surface 92 of the substrate 9 from the underside.

The gas supplier 23 includes a plurality of gas delivery ports 232 provided on the base surface 210 of the base part 21. The gas delivery ports 232 are arranged at positions overlapping the substrate 9 in plan view while being spaced below from the lower surface 92 of the substrate 9. The gas delivery ports 232 are arranged at a position radially outward of the central axis J1 while being spaced from one another in the circumferential direction on the same circumference about the central axis J1. The number of gas delivery ports 232 may, for example, be 150. The gas delivery ports 232 are circumferentially arranged radially inward of the support pins 22 below the outer peripheral portion of the substrate 9.

The gas delivery ports 232 are connected to a gas supply source, which is not shown, through a gas passage 231 provided inside the base part 21. Each gas delivery port 232 delivers a gas in a radially outward and upward direction (i.e., in a diagonally upward direction). The gas delivery ports 232 may have, for example, an approximately circular shape when viewed in the direction of delivering a gas from the gas delivery ports 232. The shape of the gas delivery ports 232 may be modified in various ways. The arrangement and number of the gas delivery ports 232 may also be modified in various ways.

The gas supplier 23 further includes a central gas delivery port 234 provided on the central portion of the base surface 210. The central gas delivery port 234 may, for example, be one delivery port arranged at a position overlapping the central axis J1 in plan view while being spaced below from the lower surface 92 of the substrate 9. The central gas delivery port 234 is connected to the aforementioned gas supply source through a gas passage 233 provided inside the base part 21. The central gas delivery port 234 delivers a gas in an approximately vertical upward direction (i.e., along the central axis J1). When viewed in the direction of delivering a gas from the central gas delivery port 234, the central gas delivery port 234 may have, for example, an approximately circular shape. The shape of the central gas delivery port 234 may be modified in various ways. The arrangement and number of the central gas delivery port 234 may also be modified in various ways.

The gas supplier 23 delivers a gas from the central gas delivery port 234 and the gas delivery ports 232 to a space (hereinafter, also referred to as the "lower space 90") between the lower surface 92 of the substrate 9 and the base surface 210 of the base part 21. The gas may, for example, be air or an inert gas such as a nitrogen gas. For example, the gas may be a high-pressure gas or a compressed gas. The gas delivered from the central gas delivery port 234 and the gas delivery ports 232 flows radially outward in the lower space 90. This forms an airflow that flows radially outward from a radial central portion (hereinafter, also simply referred to as the "central portion") of the lower space 90, and the Bernoulli effect produced by this airflow causes a pressure drop in the lower space 90. As a result, the substrate 9 is adsorbed by the substrate holder 2. In other words, the atmospheric pressure in the lower space 90 becomes lower than the atmospheric pressure above the substrate 9 (i.e., a negative pressure is generated), and this vertical difference in atmospheric pressure causes the substrate 9 to be pressed against the support pins 22 of the substrate holder 2 and fixes the position of the substrate 9 (i.e., the substrate 9 is held).

When the substrate 9 is held by the substrate holder 2, the base part 21, the central gas delivery port 234, and the gas delivery ports 232 are spaced below from the substrate 9 without contact with the substrate 9. Note that, when the substrate 9 is not adsorbed by the substrate holder 2, the substrate 9 is easily movable upward away from the support pins 22 or movable approximately horizontally in contact with the support pins 22 (i.e., slidable sideway on the support pins 22).

The substrate holder 2 has a plurality of lift pins and a plurality of centering pins, which are not shown, on the base surface 210 of the base part 21. The lift pins and the centering pins are located radially outward of the support pins 22. The lift pins pass the substrate 9 between the support pins 22 when the substrate 9 is transported into and out of the substrate processing apparatus 1. The centering pins adjust the horizontal position of the substrate 9 by pushing the outer peripheral edge of the substrate 9 in the horizontal direction when the substrate 9 is placed on the support pins 22, but not adsorbed by the support pins 22.

As illustrated in FIG. 2, the substrate rotation mechanism 33 is arranged below the substrate holder 2. The substrate rotation mechanism 33 rotates the substrate 9 together with the substrate holder 2 about the central axis J1. The substrate rotation mechanism 33 includes a shaft 331 and a motor 332. The shaft 331 is an approximately cylindrical member centered on the central axis J1. The shaft 331 extends in the up-down direction and is connected to the central portion of the lower surface of the base part 21 of the substrate holder 2. The motor 332 is an electric rotary motor that rotates the shaft 331. When the motor 332 rotates the shaft 331, the base part 21 connected to the shaft 331 is rotated together. Note that the substrate rotation mechanism 33 may include a motor having a different structure (e.g., a hollow motor).

The cup part 4 includes an annular cup 41 centered on the central axis J1. The cup 41 is arranged around the entire circumferences of the substrate 9 and the substrate holder 2 and covers the lateral sides of the substrate 9 and the substrate holder 2. The cup 41 is a liquid-receiving container that receives a liquid such as a processing liquid dispersed from the rotating substrate 9 toward the surroundings. The cup 41 is stationary in the circumferential direction and does not rotate, irrespective of whether the substrate holder 2 is rotating or stationary. The cup 41 has, at the bottom, a drain port (not shown) from which the processing liquid or the like received by the cup 41 is discharged to the outside of the chamber 11.

The cup 41 is moved in the up-down direction by an elevating mechanism, which is not shown. The elevating mechanism may include, for example, an electric linear motor, an air cylinder, or a ball screw and an electric rotary motor. The cup part 4 may include a plurality of cups 41 stacked one above another in the radial direction. In the case where the cup part 4 includes a plurality of cups 41, the cups 41 are each independently movable in the up-down direction and switched depending on the type of a processing liquid dispersed from the substrate 9 so as to receive the processing liquid.

The processing-liquid supplier 51 supplies a processing liquid (e.g., a cleaning liquid) to the upper surface 91 of the substrate 9. The processing-liquid supplier 51 includes an upper nozzle 511 that ejects the processing liquid toward the upper surface 91 of the substrate 9. For example, the upper nozzle 511 may be a two-fluid nozzle that mixes the processing liquid and a gas and sprays the resultant processing liquid toward the upper surface 91 of the substrate 9. In the processing liquid supplier 51, the processing liquid is pulverized into particles by collision with a high-speed flow of gas and sprayed in a pulverized state at high speed to the upper surface 91 of the substrate 9. Accordingly, the upper surface 91 of the substrate 9 is physically cleaned, and foreign materials adhering to the upper surface 91 of the substrate 9 are removed. The processing liquid may, for example, be DIW or $CO_2$ water. The gas may, for example, be air or an inert gas such as a nitrogen gas. For example, the gas may be a high-pressure gas or a compressed gas.

The processing-part movement mechanism 52 is an oscillation mechanism that oscillates the upper nozzle 511 of the processing-liquid supplier 51 approximately horizontally in the space above the substrate 9. The processing-part movement mechanism 52 includes an arm 521 and an arm rotation mechanism 522. The arm 521 is a rod-like member extending in an approximately horizontal direction. One end of the arm 521 is fixed to the upper nozzle 511, and the other end of the arm 521 is connected to the arm rotation mechanism 522 located radially outward of the cup part 4. The arm rotation mechanism 522 rotates the arm 521 in an approximately horizontal direction about a rotation shaft extending in the up-down direction.

The processing-part movement mechanism 52 reciprocally moves the upper nozzle 511, which ejects the processing liquid to the rotating substrate 9, between a first position and a second position. The first position faces the central portion of the upper surface 91 of the substrate 9 in the up-down direction, and the second position is located radially outward of the first position. It is preferable that the second position faces the outer peripheral portion of the upper surface 91 of the substrate 9 in the up-down direction. In this case, the aforementioned physical cleaning processing is performed across approximately the entire upper surface 91 of the substrate 9. After the cleaning processing ends, the processing-part movement mechanism 52 moves the upper nozzle 511 of the processing-liquid supplier 51 from the space above the substrate 9 to a retracted position that is located radially outward of the outer peripheral edge of the substrate 9. The arm rotation mechanism 522 of the processing-part movement mechanism 52 may include, for example, an electric rotary motor. The processing-part movement mechanism 52 may have a different structure.

As illustrated in FIG. 4, the base surface 210 of the base part 21 expands radially outward and approximately horizontally from the central axis J1 and forms an inclined surface that expands radially outward and upward below the outer peripheral portion of the substrate 9. The base surface 210 slopes downward outside the support pins 22 in the radial direction and forms a horizontal surface that expands approximately horizontally from a position radially outward of the outer peripheral edge of the substrate 9 in plan view. The base surface 210 expands radially outward and downward from the radial outer edge of the horizontal surface.

As illustrated in FIGS. 3 and 4, the base surface 210 includes a first surface 211, a second surface 212, a third surface 213, a fourth surface 214, and a fifth surface 215. The first surface 211, the second surface 212, the third surface 213, the fourth surface 214, and the fifth surface 215 are contiguous in the order specified in a radially outward direction from the central axis J1. The first surface 211 is an approximately circular surface that expands approximately horizontally about the central axis J1 (i.e., approximately perpendicular to the central axis J1). The first surface 211 faces the central portion of the substrate 9 in the up-down direction.

The second surface 212 is an approximately annular surface that expands radially outward from an approximately circumferential outer peripheral edge of the first surface 211 below the substrate 9. The outer peripheral edge of the first surface 211 (i.e., the boundary between the first surface 211 and the second surface 212) overlaps the substrate 9 in plan view. In the following description, "below the substrate 9" refers to a position overlapping the substrate 9 in plan view below the lower surface 92 of the substrate 9 in the up-down direction. The second surface 212 is an inclined surface that slopes upward in a radially outward direction from the outer peripheral edge of the first surface 211. In the example illustrated in FIG. 4, the second surface 212 as a whole is located below the lower surface 92 of the substrate 9 in the up-down direction. The second surface 212 has an approximately linear longitudinal section and has an approximately constant inclination angle (acute angle) with respect to the horizontal direction. In other words, the second surface 212 is a flat inclined surface that slopes upward in a radially outward direction at a predetermined inclination angle from the outer peripheral edge of the first surface 211. Note that the second surface 212 may, for example, be a curved surface that is convex radially inward and upward.

The second surface 212 has the aforementioned support pins 22 arranged thereon. The support pins 22 are located radially inward of an approximately circumferential outer peripheral edge of the second surface 212 (i.e., the upper edge of the second surface 212) and project upward from the second surface 212. The aforementioned gas delivery ports 232 are provided on the boundary between the second surface 212 and the first surface 211 or at positions radially inward of the boundary on the first surface 211.

The third surface 213 is an approximately annular surface that is contiguous to the outer peripheral edge of the second surface 212 below the lower surface 92 of substrate 9 in the up-down direction. In the example illustrated in FIG. 4, the outer peripheral edge of the second surface 212 (i.e., the boundary between the second surface 212 and the third surface 213) overlaps the substrate 9 in plan view. In other words, the third surface 213 is contiguous to the outer peripheral edge of the second surface 212 below the substrate 9. The third surface 213 is an inclined surface that slopes downward in a radially outward direction from the outer peripheral edge of the second surface 212. For example, the third surface 213 may be a curved surface that is convex radially outward and upward. That is, the third surface 213 has an inclination angle (acute angle) that increases in a radially outward direction with respect to the horizontal direction. For example, the third surface 213 may be part of an approximately annular outer surface centered on the central axis J1.

Note that the third surface 213 may be a flat inclined surface that has an approximately constant inclination angle, or may be a curved surface that is convex radially inward and downward. As another alternative, the third surface 213 may be a surface that expands approximately vertically downward from the outer peripheral edge of the second surface 212. In this case, the third surface 213 is an approximately cylindrical surface centered on the central axis J1.

The fourth surface 214 is an approximately annular surface that expands radially outward from an approximately circumferential lower edge of the third surface 213. In the example illustrated in FIG. 4, the fourth surface 214 expands approximately horizontally from the lower edge of the third surface 213. In other words, the fourth surface 214 is a horizontal surface that expands approximately perpendicular to the central axis J1 at approximately the same position in the up-down direction as the lower edge of the third surface 213. The lower edge of the third surface 213 (i.e., the boundary between the third surface 213 and the fourth surface 214) is located radially outward of the outer peripheral edge of the substrate 9. Therefore, the fourth surface 214 as a whole is located radially outward of the outer peripheral edge of the substrate 9. Note that, in the case where the third surface 213 is an inclined surface that slopes radially outward and downward from the outer peripheral edge of the second surface 212, the boundary between the third surface 213 and the fourth surface 214 corresponds to the outer peripheral edge of the third surface 213.

The fourth surface 214 of the base surface 210 may be an inclined surface that slopes downward in a radially outward direction from the lower edge of the third surface 213. The boundary between the third surface 213 and the fourth surface 214 may be located at approximately the same position in the radial direction as the outer peripheral edge of the substrate 9. In this case, the inner peripheral edge of the fourth surface 214 overlaps the outer peripheral edge of the substrate 9 in plan view, and the portion of the fourth surface 214 other than the inner peripheral edge thereof is located radially outward of the outer peripheral edge of the substrate 9 and does not overlap the substrate 9 in plan view. The boundary between the third surface 213 and the fourth surface 214 of the base surface 210 may be located radially inward of the outer peripheral edge of the substrate 9. In this case, the inner peripheral portion of the fourth surface 214 overlaps the outer peripheral portion of the substrate 9 in plan view, and the portion of the fourth surface 214 other than the inner peripheral portion thereof is located radially outward of the outer peripheral edge of the substrate 9 and does not overlap the substrate 9 in plan view.

The fifth surface 215 is an approximately annular surface that expands radially outward from an approximately circumferential outer peripheral edge of the fourth surface 214. The outer peripheral edge of the fourth surface 214 (i.e., the boundary between the fourth surface 214 and the fifth surface 215) is located radially outward of the outer peripheral edge of the substrate 9. The fifth surface 215 is an inclined surface that slopes downward in a radially outward direction from the outer peripheral edge of the fourth surface 214. In the example illustrated in FIG. 4, the fifth surface 215 has an approximately linear longitudinal section and has an approximately constant inclination angle (acute angle) with respect to the horizontal direction. Note that the fifth surface 215 may be a curved surface that is convex radially outward and upward.

Figure 5:
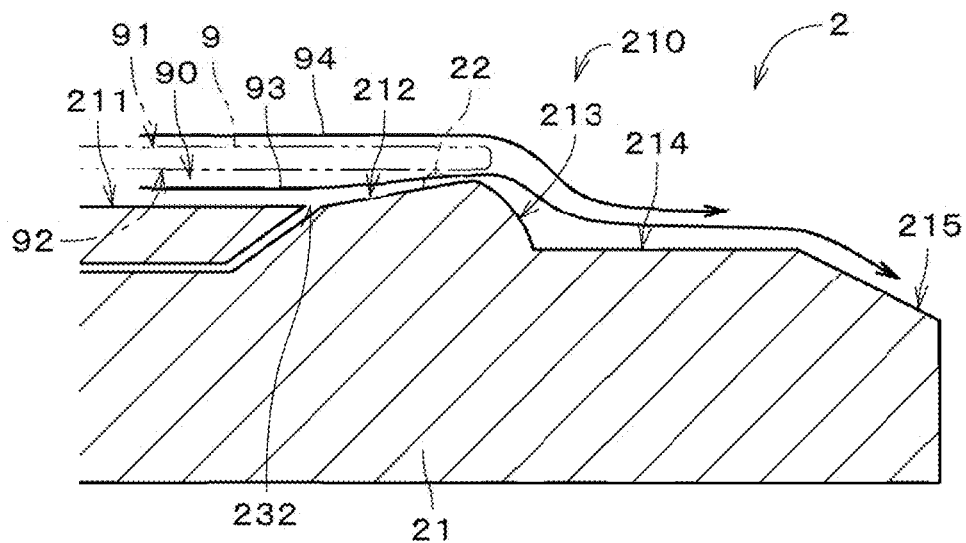
FIG. 5 is a sectional view illustrating an outer peripheral portion of the substrate holder.

FIG. 5 is a diagram illustrating an area in the vicinity of the outer peripheral portion of the base part 21 in enlarged dimensions. FIG. 5 is a longitudinal sectional view of the base part 21 at a position where no support pins 22 are arranged, so that the support pins 22 are indicated by the chain double-dashed line in FIG. 5. In the substrate processing apparatus 1, as described above, the gas delivered from the central gas delivery port 234 (see FIG. 4) and the gas delivery ports 232 forms the airflow that flows radially outward from the radial central portion of the lower space 90. Then, the Bernoulli effect produced by this airflow causes a pressure drop in the lower space 90 and causes the substrate 9 to be adsorbed by the substrate holder 2. In FIG. 5, this airflow is indicated conceptually by the arrow denoted with the reference numeral 93. In the substrate processing apparatus 1, when the substrate 9 is rotated by the substrate rotation mechanism 33 (see FIG. 2), the speed of the airflow 93 is enhanced by centrifugal force. In other words, when the substrate 9 is rotating, the flow rate of the gas flowing in a radially outward direction increases in the lower space 90. In the present embodiment, the number of rotations of the substrate 9 may, for example, be in the range of 200 rpm to 1500 rpm. The flow rate of the gas supplied from the central gas delivery port 234 and the gas delivery ports 232 to the lower space 90 may, for example, be in the range of 270 L/min to 300 L/min.

Moreover, in the substrate processing apparatus 1, the gas above the upper surface 91 of the substrate 9 is moved radially outward by centrifugal force induced by the rotation of the substrate 9. This forms an airflow that flows radially outward from the radial central portion of the upper surface 91 of the substrate 9. In FIG. 5, this airflow is indicated conceptually by the arrow denoted with the reference numeral 94. The airflow 94 flowing radially outward along the upper surface 91 of the substrate 9 flows in a radially outward and downward direction along the base surface 210 by the Coanda effect produced between the airflow 94 and the base surface 210 outside the outer peripheral edge of the substrate 9 in the radial direction. Accordingly, downward force acts on the portion of the substrate 9 in the vicinity of the outer peripheral edge thereof, and the outer peripheral portion of the substrate 9 is pressed against the support pins 22. This results in an improvement in the stability of holding the substrate 9 by the substrate holder 2. In other words, in the substrate processing apparatus 1, the substrate 9 is firmly held by the substrate holder 2 by the Bernoulli effect produced by the airflow 93 and the Coanda effect produced by the airflow 94.

In the substrate processing apparatus 1, as described above, the processing liquid supplied to the upper surface 91 of the substrate 9 is caused to flow radially outward by centrifugal force induced by the rotation of the substrate 9 and scatters radially outward of the outer peripheral edge of the substrate 9. The negative pressure generated by the aforementioned Bernoulli effect exerts forces in the direction of causing a fluid to flow around to the lower surface 92 of the substrate 9 on the processing liquid in the vicinity of the outer peripheral edge of the substrate 9. Meanwhile, the airflow 94, which is caused to flow along the base surface 210 from the outer peripheral edge of the substrate 9 by the aforementioned Coanda effect, exerts forces in the direction of causing a fluid to flow radially outward and downward from the outer peripheral edge of the substrate 9 on the processing liquid in the vicinity of the outer peripheral edge of the substrate 9. This reduces the possibility that the processing liquid on the upper surface 91 of the substrate 9 may flow around to the lower surface 92 of the substrate 9 and adhere to the lower surface 92.

In the substrate holder 2, as described above, the second surface 212 of the base part 21 forms an inclined surface that slopes upward in a radially outward direction below the outer peripheral portion of the substrate 9. This gradually reduces the height of the lower space 90 in the up-down direction (hereinafter, simply referred to as the "height") and increases the speed of the airflow 93 below the outer peripheral portion of the substrate 9. As a result, it is possible to increase adsorption power of the substrate 9 generated by the Bernoulli effect (i.e., the force of causing the substrate 9 to be pressed against the support pins 22 by the Bernoulli effect). Besides, a relatively large distance in the up-down direction can be ensured between the first surface 211 and the lower surface 92 of the substrate 9. Accordingly, it is possible to reduce the possibility that the substrate 9 may be pushed upward by the gas delivered from the central gas delivery port 234 (see FIG. 4) and the gas delivery ports 232.

In the substrate holder 2, the presence of the third surface 213, which expands downward from the outer peripheral edge of the second surface 212, increases the force of causing the substrate 9 to be pressed against the support pins 22 by the Coanda effect. As a result, it is possible to improve the stability of holding the substrate 9. Besides, the airflow 94 generated by the Coanda effect guides the processing liquid on the upper surface 91 of the substrate 9 in a downward direction from the outer peripheral edge. Accordingly, it is possible to reduce the possibility that the processing liquid may flow around to the lower surface 92 (i.e., flow radially inward from the outer peripheral edge of the substrate 9).

In the substrate holder 2, the presence of the fourth surface 214, which expands radially outward from the outer peripheral edge of the third surface 213, guides the airflow 94 in a radially downward direction, the airflow 94 flowing downward from the outer peripheral edge of the substrate 9 due to the Coanda effect. This further reduces the possibility that the processing liquid on the upper surface 91 of the substrate 9 may flow around to the lower surface 92 of the substrate 9 and adhere to the lower surface 92. Besides, the force surface 214 does not expand upward of the lower edge of the third surface 213. This enables favorably forming the airflow 94 that flows radially outward and downward from the outer peripheral edge of the substrate 9. This further improves the stability of holding the substrate 9. From the viewpoint of improving the stability of holding the substrate 9, it is preferable that the fourth surface 214 has no annular upwardly-projecting structure or the like.

In the substrate holder 2, the presence of the fifth surface 215, which slopes downward in a radially outward direction from the outer peripheral edge of the fourth surface 214, guides the airflow 93 in a diagonally downward direction, the airflow 93 flowing radially outward along the fourth surface 214. This reduces the possibility that the airflow 93 may collide (i.e., merge) with the airflow 94 flowing radially outward and downward from the outer peripheral edge of the substrate 9 and form a turbulent flow. As a result, it is possible to favorably achieve the force of causing the outer peripheral portion of the substrate 9 to be pressed downward by the Coanda effect and to further improve the stability of holding the substrate 9.

Figure 6:
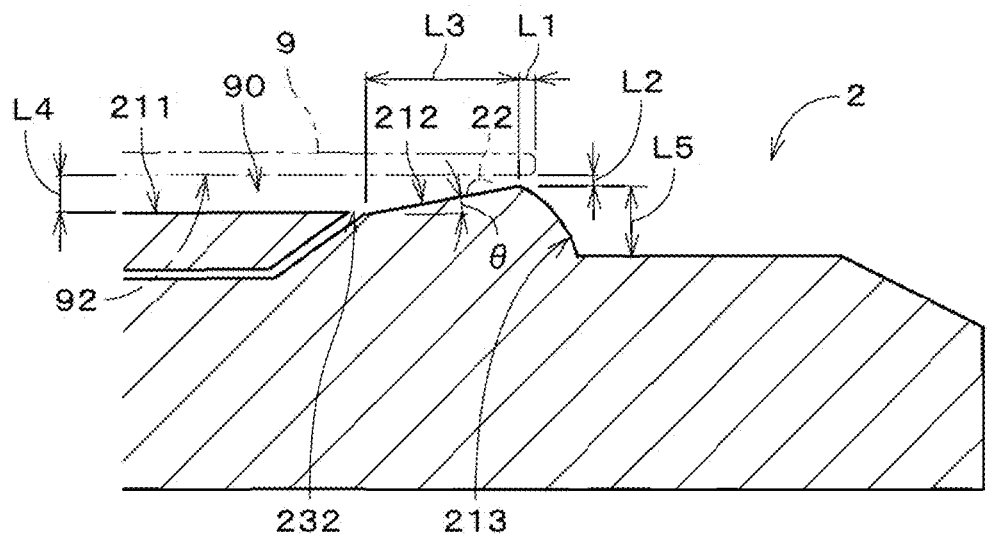
FIG. 6 is a sectional view illustrating the outer peripheral portion of the substrate holder.

As illustrated in FIG. 6, in the substrate holder 2, a distance L1 in the radial direction between the outer peripheral edge of the substrate 9 and the boundary between the second surface 212 and the third surface 213 (i.e., the inner peripheral edge of the third surface 213) located below the substrate 9 may preferably be greater than or equal to 0.5 mm and less than or equal to 2.0 mm. If the distance L1 is greater than or equal to 0.5 mm, it is possible to reduce the possibility that the airflow 93 that has passed through the boundary between the second surface 212 and the third surface 213 in a radially outward direction (see FIG. 5) may flow radially outward and upward from the outer peripheral edge of the substrate 9. This suppresses the occurrence of a turbulent flow resulting from the collision of the airflow 93 with the airflow 94 (see FIG. 5) generated by the Coanda effect in the vicinity of the outer peripheral edge of the substrate 9. As a result, it is possible to favorably achieve the force of causing the outer peripheral portion of the substrate 9 to be pressed downward by the Coanda effect and to further improve the stability of holding the substrate 9. On the other hand, if the distance L1 is less than or equal to 2.0 mm, the adsorption power generated by the Bernoulli effect can favorably act on the portion of the substrate 9 in the vicinity of the outer peripheral edge. As a result, it is possible to further improve the stability of holding the substrate 9.

In the substrate holder 2, a distance L2 in the up-down direction between the lower surface 92 of the substrate 9 and the boundary between the second surface 212 and the third surface 213 may preferably be greater than or equal to 0.6 mm and less than or equal to 1.0 mm. If the distance L2 is greater than or equal to 0.6 mm, it is possible to suppress an excessive increase in the speed of the airflow 93 that passes through the boundary between the second surface 212 and the third surface 213 in a radially outward direction. This suppresses the occurrence of a turbulent flow resulting from a collision of the airflow 93 with the airflow 94 generated by the Coanda effect in the vicinity of the outer peripheral edge of the substrate 9. As a result, it is possible to favorably achieve the force of causing the outer peripheral portion of the substrate 9 to be pressed downward by the Coanda effect and to further improve the stability of holding the substrate 9. On the other hand, if the distance L2 is less than or equal to 1.0 mm, it is possible to suppress a reduction in the speed of the airflow 93 below the outer peripheral portion of the substrate 9 and to suppress an excessive decrease in the adsorption power of the substrate 9 generated by the Bernoulli effect. It is also possible to favorably reduce the possibility that the processing liquid in the vicinity of the outer peripheral edge of the substrate 9 may flow around to the lower surface 92 of the substrate 9 due to the negative pressure generated by the Bernoulli effect. As a result, it is possible to further suppress adhesion of the processing liquid to the lower surface 92 of the substrate 9.

In the substrate holder 2, the aforementioned inclination angle θ of the second surface 212 is less than or equal to 15 degrees. This suppresses an excessive pressure rise in the lower space 90 in the vicinity of the support pins 22. As a result, it is possible to reduce the possibility that the absorption of the substrate 9 by the Bernoulli effect may be impaired by the aforementioned excessive pressure rise and to further improve the stability of holding the substrate 9. In the case where the second surface 212 is a curved surface that is convex radially inward and upward, the aforementioned inclination angle θ is the angle (acute angle) formed by a straight line extending in the horizontal direction and a virtual straight line that connects the inner and outer peripheral edges of the second surface 212 in a longitudinal section of the substrate holder 2 that passes through the central axis J1. Although there are no particular limitations on the lower limit for the inclination angle θ of the second surface 212, in actuality the inclination angle θ may be greater than or equal to 10 degrees.

In the substrate holder 2, a radial length L3 of the second surface 212 (i.e., the shortest distance in the radial direction between the inner and outer peripheral edges of the second surface 212) is greater than or equal to 10 mm. In this case, it is possible to increase the speed of the airflow 93 below the outer peripheral portion of the substrate 9 without an excessive increase in the inclination angle θ of the second surface 212. As a result, it is possible to favorably increase the adsorption power of the substrate 9 generated by the Bernoulli effect and to further improve the stability of holding the substrate 9. Although there are no particular limitations on the upper limit for the radial length L3 of the second surface 212, in actuality the length L3 may be less than or equal to 20 mm.

In the substrate holder 2, a distance L4 in the up-down direction between the first surface 211 and the lower surface 92 of the substrate 9 may preferably be greater than or equal to 0.6 mm and less than or equal to 1.5 mm. If the distance L4 is greater than or equal to 0.6 mm, it is possible to reduce the possibility that the substrate 9 may be pressed upward by the gas delivered from the central gas delivery port 234 (see FIG. 4) and the gas delivery ports 232. If the distance L4 is less than or equal to 1.5 mm, it is possible to suppress a reduction in the speed of the airflow 93 below the substrate 9 and to suppress an excessive decrease in the adsorption power of the substrate 9 generated by the Bernoulli effect. As a result, it is possible to further improve the stability of holding the substrate 9.

In the substrate holder 2, a height L5 in the up-down direction of the third surface 213 (i.e., the distance in the up-down direction between the upper and lower edges of the third surface 213) may preferably be greater than or equal to 1 mm. In this case, it is possible to enhance the Coanda effect and to further improve the stability of holding the substrate 9. Although there are no particular limitations on the upper limit for the height L5 of the third surface 213, in actuality the height L5 may be less than or equal to 10 mm.

As described thus far, the substrate processing apparatus 1 for processing substrates 9 includes the substrate holder 2, the substrate rotation mechanism 33, and the processing-liquid supplier 51. The substrate holder 2 holds a substrate 9 in a horizontal position. The substrate rotation mechanism 33 rotates the substrate holder 2 about the central axis J1 pointing in the up-down direction. The processing-liquid supplier 51 supplies a processing liquid to the upper surface 91 of the substrate 9. The substrate holder 2 includes the base part 21, the support pins 22, and the gas supplier 23. The base part 21 faces the lower surface 92 of the substrate 9. The base part 21 has the base surface 210 that extends radially outward of the outer peripheral edge of the substrate 9. The support pins 22 are arranged in the circumferential direction on the base surface 210. The support pins 22 project upward from the base surface 210 to come in contact with the outer peripheral portion of the lower surface 92 of the substrate 9. The gas supplier 23 delivers a gas between the lower surface 92 of the substrate 9 and the base surface 210 of the base part 21 to form the airflow 93 flowing radially outward and to cause a pressure drop in the space between the substrate 9 and the base part 21 (i.e., the lower space 90) by the Bernoulli effect.

The base surface 210 includes the first surface 211, the second surface 212, the third surface 213, and the fourth surface 214. The first surface 211 is a circular horizontal surface that faces the central portion of the substrate 9 in the up-down direction. The second surface 212 is an annular surface that expands radially outward from the outer peripheral edge of the first surface 211 below the substrate 9. The second surface 212 slopes upward in a radially outward direction. The second surface 212 has the aforementioned support pins 22 arranged thereon. The third surface 213 is an annular surface that is contiguous to the outer peripheral edge of the second surface 212 below the lower surface 92 of the substrate 9. The third surface 213 expands vertically downward from the outer peripheral edge of the second surface 212. The third surface 213 also slopes downward in a radially outward direction from the outer peripheral edge of the second surface 212. The fourth surface 214 is an annular surface that is contiguous to the lower edge of the third surface 213. The fourth surface 214 expands radially outward outside the outer peripheral edge of the substrate 9 in the radial direction. The gas supplier 23 includes the circumferential gas delivery port 232 that is provided on the first surface 211 or on the boundary between the first surface 211 and the second surface 212 to deliver a gas in a radially outward direction.

In the substrate processing apparatus 1, as described above, the Bernoulli effect generated by the airflow 93 and the airflow 94 generated by the Coanda effect suppress adhesion of the processing liquid to the lower surface 92 of the substrate 9 and improve the stability of holding the substrate 9.

In the substrate processing apparatus 1, it is preferable that the fourth surface 214 expands at the same level in the up-down direction as the lower edge of the third surface 213 or slopes downward in a radially outward direction from the lower edge of the third surface 213. In this case, as described above, the airflow 94 flowing downward from the outer peripheral edge of the substrate 9 due to the Coanda effect is favorably guided in a radially outward direction. As a result, it is possible to further suppress the adhesion of the processing liquid to the lower surface 92 of the substrate 9 and to further improve the stability of holding the substrate 9.

In the substrate processing apparatus 1, it is preferable that the base surface 210 further includes the annular fifth surface 215 that slopes downward in a radially outward direction from the outer peripheral edge of the fourth surface 214. In this case, as described above, it is possible to enhance the Coanda effect and to further improve the stability of holding the substrate 9.

As described above, it is preferable that the third surface 213 is a curved surface that slopes downward in a radially outward direction from the outer peripheral edge of the second surface 212 and that is convex radially outward and upward. In this case, it is possible to enhance the Coanda effect and to further improve the stability of holding the substrate 9.

Figure 7A:
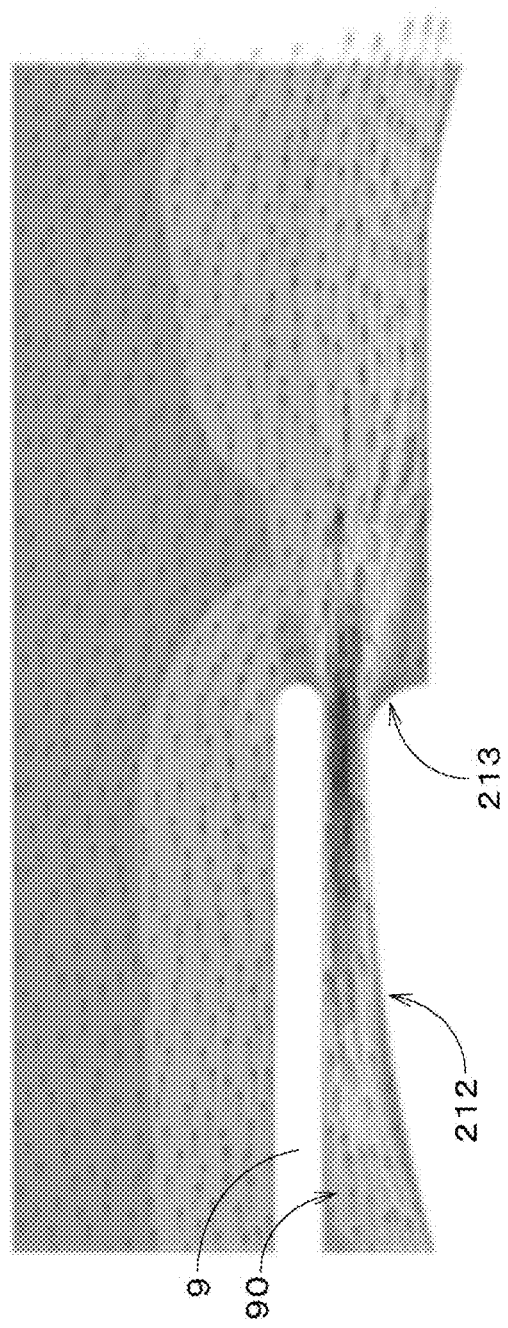
FIG. 7A is a diagram showing the flow of gas in the vicinity of the outer peripheral portion of the substrate.

FIGS. 7A to 7C are diagrams showing the flow of gas obtained with different shapes of the third surface 213 by computational fluid dynamics (CFD) simulation. FIGS. 7A to 7C show the flow of gas in the vicinity of the outer peripheral portion of the substrate 9. The CFD simulation was conducted by Ansys Fluent developed by Ansys Inc. on conditions that the rotation speed of the substrate 9 was 1500 rpm and the flow rate of the gas supplied from the gas supplier 23 (see FIG. 4) to the lower space 90 was 300 L/min. Note that, although the shapes of the second surface 212 in FIGS. 7A to 7C were slightly different from the shape described in the above examples, the tendency of CFD simulation results was not so much different.

In FIG. 7A, the third surface 213 was a curved surface that expanded radially outward and downward from the outer peripheral edge of the second surface 212 and that was convex radially outward and upward. The third surface 213 had an inclination angle of approximately 50 degrees with respect to the horizontal direction (i.e., the angle (acute angle) formed by a straight line extending in the horizontal direction and a virtual line connecting the inner and outer peripheral edges of the third surface 213 in a longitudinal section of the substrate holder 2 that passes through the central axis J1). In FIG. 7B, the third surface 213 was a flat inclined surface that expanded radially outward and downward from the outer peripheral edge of the second surface 212. The third surface 213 had an inclination angle of approximately 45 degrees with respect to the horizontal direction. From the viewpoint of favorably generating the aforementioned Coanda effect, the inclination angles of the third surface 213 shown in FIGS. 7A and 7B were preferably greater than or equal to 30 degrees. In FIG. 7C, the third surface 213 was a cylindrical surface that expanded vertically downward from the outer peripheral edge of the second surface 212.

It can be seen from FIGS. 7A to 7C that, in the case where the third surface 213 is the aforementioned curved surface (in the case corresponding to FIG. 7A), the flow of gas flowing radially outward from above the substrate 9 is most largely concave downward and the aforementioned Coanda effect becomes most prominent in the vicinity of the outer peripheral edge of the substrate 9 (i.e., outside the outer peripheral edge of the substrate 9 in the radial direction). In the case where the third surface 213 is the aforementioned curved surface, the holding power (i.e., adsorption power) acting on the substrate 9 is greater by approximately 1% to 2% than the holding power acting when the third surface 213 is the aforementioned inclined or cylindrical surface (in the case corresponding to FIG. 7B or 7C).

In the substrate processing apparatus 1, it is preferable that the third surface 213 is contiguous to the outer peripheral edge of the second surface 212 below the substrate 9. This suppresses the occurrence of a turbulent flow resulting from a collision of the airflow 93 (see FIG. 5) that flows radially outward through the boundary between the second surface 212 and the third surface 213 with the airflow 94 (see FIG. 5) that flows radially outward and downward from the outer peripheral edge of the substrate 9 due to the Coanda effect, in the vicinity of the outer peripheral edge of the substrate 9. Accordingly, it is possible to favorably achieve the force of causing the outer peripheral portion of the substrate 9 to be pressed downward by the Coanda effect and to further improve the stability of holding the substrate 9.

Figure 8C:
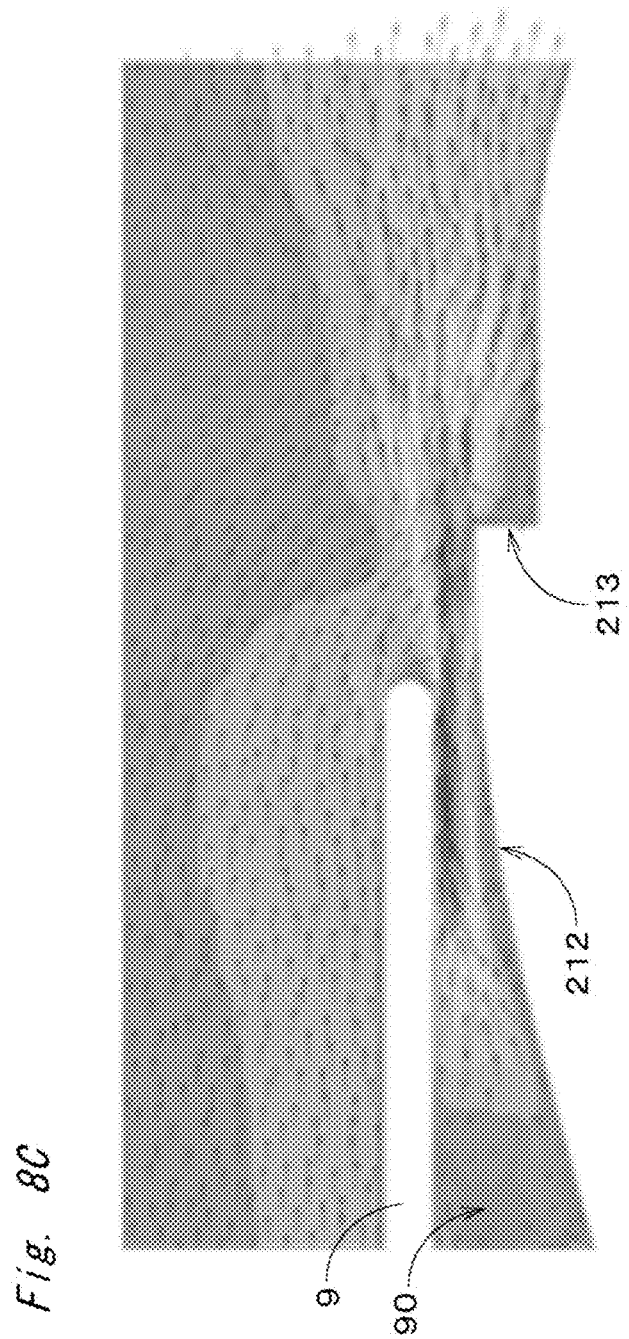
FIG. 8C is a diagram showing the flow of gas in the vicinity of the outer peripheral portion of the substrate.

FIGS. 8A to 8C are diagrams showing the flow of gas obtained with different positional relationships between the outer peripheral edge of the substrate 9 and the boundary between the second surface 212 and the third surface 213 by CFD simulation. In FIGS. 8A to 8C, the CFD simulation showing the flow of gas in the vicinity of the outer peripheral portion of the substrate 9 was conducted by Ansys Fluent developed by the Ansys Inc. on conditions that the rotation speed of the substrate 9 was 1000 rpm and the flow rate of the gas supplied from the gas supplier 23 to the lower space 90 was 300 L/min. Note that, although the shapes of the second surface 212 and the third surface 213 in FIGS. 8A to 8C were slightly different from those described in the above examples, the tendency of CFD simulation results was not so much different.

In FIG. 8A, the boundary between the second surface 212 and the third surface 213 was located below the substrate 9, and the aforementioned distance L1 (i.e., the distance in the radial direction between the outer peripheral edge of the substrate 9 and the boundary between the second surface 212 and the third surface 213) was 0.5 mm. In FIG. 8B, the boundary between the second surface 212 and the third surface 213 was located below the substrate 9, and the distance L1 was 3.5 mm. In FIG. 8C, the boundary between the second surface 212 and the third surface 213 was not located below the substrate 9 and was located radially outward of the outer peripheral edge of the substrate 9. The boundary between the second surface 212 and the third surface 213 was located radially outward of the position shown in FIG. 8A by 3.0 mm.

As shown in FIG. 8C, in the case where the boundary between the second surface 212 and the third surface 213 is not located below the substrate 9, the flow of gas flowing radially outward from above the substrate 9 and the flow of gas flowing radially outward from below the substrate 9 collide with each other and produce a turbulent flow in the vicinity of the outer peripheral edge of the substrate 9 (i.e., outside the outer peripheral edge of the substrate 9 in the radial direction). On the other hand, in the case where the boundary between the second surface 212 and the third surface 213 is located blow the substrate 9 as shown in FIGS. 8A and 8B, the collision between the flow of gas flowing radially outward from above the substrate 9 and the flow of gas flowing radially outward from below the substrate 9 is suppressed in the vicinity of the outer peripheral edge of the substrate 9. As a result, it is possible to favorably achieve the force of causing the outer peripheral portion of the substrate 9 to be pressed downward by the Coanda effect and to improve the stability of holding the substrate 9. In the case where the boundary between the second surface 212 and the third surface 213 is located below the substrate 9, the holding power (i.e., adsorption power) acting on the substrate 9 is greater by approximately 7% to 8% than the holding power acting when the boundary is not located below the substrate 9.

Besides, as shown in FIGS. 8A and 8B, in the case where the aforementioned distance L1 is greater than or equal to 0.5 mm and less than or equal to 2.0 mm (in the case corresponds to FIG. 8A), the flow of gas flowing radially outward from above the substrate 9 is more largely concave downward in the vicinity of the outer peripheral edge of the substrate 9 than in the case where the distance L1 is greater than 2.0 mm (in the case corresponding to FIG. 8B). This indicates that, in the case where the distance L1 is greater than or equal to 0.5 mm and less than or equal to 2.0 mm, it is possible to enhance the aforementioned Coanda effect and to improve the stability of holding the substrate 9.

The substrate processing apparatus 1 described above may be modified in various ways.

For example, the number and shape of the support pins 22 are not limited to those described in the above examples, and may be modified in various ways. Moreover, the number, shape, and arrangement of the gas delivery ports 232 are not limited to those described in the above examples, and may be modified in various ways. For example, the base surface 210 may have one approximately annular gas delivery port centered on the central axis J1, instead of the gas delivery ports 232.

In the substrate holder 2, the shape and dimensions of the base surface 210 are not limited to those described in the above examples, and may be modified in various ways. For example, the distance L4 in the up-down direction between the first surface 211 and the lower surface 92 of the substrate 9 may be less than 0.6 mm, or may be greater than 1.5 mm. The distance L2 in the up-down direction between the lower surface 92 of the substrate 9 and the boundary between the second surface 212 and the third surface 213 may be less than 0.6 mm, or may be greater than or equal to 1.0 mm. The distance L1 in the radial direction between the outer peripheral edge of the substrate 9 and the boundary between the second surface 212 and the third surface 213 may be less than 0.5 mm, or may be greater than 2.0 mm.

In the substrate holder 2, the radial length L3 of the second surface 212 may be less than 10 mm. Moreover, the inclination angle θ of the second surface 212 may be greater than 15 degrees. The second surface 212 does not necessarily have to be inclined along the entire length from the inner peripheral edge to the outer peripheral edge, and for example, a portion of the second surface 212 in the vicinity of the outer peripheral edge may be a horizontal surface that is approximately perpendicular to the central axis J1. In this case, the support pins 22 may be arranged on this horizontal surface.

In the substrate holder 2, the third surface 213 may be contiguous to the outer peripheral edge of the second surface 212 outside the outer peripheral edge of the substrate 9 in the radial direction.

In the substrate holder 2, the fourth surface 214 may expand upward in a radially outward direction from the lower edge of the third surface 213. The base surface 210 may not include the fifth surface 215.

In the examples described above, the substrate 9 to be processed by the substrate processing apparatus 1 has an approximately uniform thickness in the up-down direction across the entire surface, but the present invention is not limited thereto. For example, the substrate 9 may be configured such that the outer peripheral portion of the substrate 9 is greater in thickness than the region of the substrate 9 that is located inward of the outer peripheral portion (this region is hereinafter referred to as the "main portion"). For example, the main portion of the upper surface 91 of the substrate 9 may be more largely concave downward than the outer peripheral portion thereof. Such a substrate 9 may be formed by, for example, performing processing for grinding a portion corresponding to the main portion (i.e., grinding processing) on a substrate having an approximately uniform thickness.

The substrate processing apparatus 1 may be used to process substrates other than semiconductor substrates, such as glass substrates for use in flat panel displays (FPDs) such as liquid crystal displays or organic electro luminescence (EL) displays, or glass substrates for use in other display devices. The substrate processing apparatus 1 described above may also be used to process substrates such as optical disk substrates, magnetic disk substrates, magneto-optical disk substrates, photomask substrates, ceramic substrates, or solar cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST 1 substrate processing apparatus
2 substrate holder
5 processing-liquid supplier
9 substrate
21 base part
22 support pin
23 gas supplier
33 substrate rotation mechanism
51 processing liquid supplier
90 lower space
91 upper surface (of substrate)
92 lower surface (of substrate)
210 base surface
211 first surface
212 second surface
213 third surface
214 fourth surface
215 fifth surface
232 gas delivery port
J1 central axis

The invention claimed is:

1. A substrate processing apparatus for processing a substrate, comprising:
a substrate holder that holds a substrate in a horizontal position;
a substrate rotation mechanism that rotates said substrate holder about a central axis pointing in an up-down direction; and
a processing-liquid supplier that supplies a processing liquid to an upper surface of said substrate,
wherein said substrate holder includes:
a base part having a base surface that faces a lower surface of said substrate and that extends radially outward of an outer peripheral edge of said substrate;
a plurality of support pins that are aligned in a circumferential direction on said base surface and that project upward from said base surface to come in contact with an outer peripheral portion of said lower surface of said substrate; and
a gas supplier that delivers a gas between said lower surface of said substrate and said base surface of said base part to form an airflow flowing radially outward and to cause a pressure drop in a space between said substrate and said base part by a Bernoulli effect, and
said base surface includes:
a first surface that is a circular horizontal surface facing a central portion of said substrate in the up-down direction;
a second surface that is an annular surface expanding radially outward from an outer peripheral edge of said first surface below said substrate, the second surface sloping upward in a radially outward direction and having said plurality of support pins arranged thereon;
a third surface that is an annular surface contiguous to an outer peripheral edge of said second surface below said lower surface of said substrate, the third surface expanding vertically downward from said outer peripheral edge of said second surface or sloping downward in the radially outward direction; and a fourth surface that is an annular surface contiguous to a lower edge of said third surface, the fourth surface expanding radially outward outside said outer peripheral edge of said substrate in the radially outward direction, and said gas supplier includes a circumferential gas delivery port provided on said first surface or on a boundary between said first surface and said second surface to deliver a gas in the radially outward direction.

2. The substrate processing apparatus according to claim 1, wherein said fourth surface expands at the same level in the up-down direction as said lower edge of said third surface or slopes downward in the radially outward direction from said lower edge of said third surface.

3. The substrate processing apparatus according to claim 1, wherein said base surface further includes an annular fifth surface that slopes downward in the radially outward direction from an outer peripheral edge of said fourth surface.

4. The substrate processing apparatus according to claim 1, wherein said third surface is a curved surface that slopes downward in the radially outward direction from said outer peripheral edge of said second surface and that is convex radially outward and upward.

5. The substrate processing apparatus according to claim 1, wherein said third surface is contiguous to said outer peripheral edge of said second surface below said substrate.

6. The substrate processing apparatus according to claim 5, wherein a distance in the radially outward direction between said outer peripheral edge of said substrate and a boundary between said second surface and said third surface is greater than or equal to 0.5 mm and less than or equal to 2.0 mm.

7. The substrate processing apparatus according to claim 1, wherein a distance in the up-down direction between said lower surface of said substrate and a boundary between said second surface and said third surface is greater than or equal to 0.6 mm and less than or equal to 1.0 mm.

8. The substrate processing apparatus according to claim 1, wherein said second surface is an inclined surface that slopes radially outward and upward at a predetermined inclination angle from said outer peripheral edge of said first surface, and said predetermined inclination angle of said second surface is less than or equal to 15 degrees.

9. The substrate processing apparatus according to claim 1, wherein said second surface has a radial length of 10 mm or more.

10. The substrate processing apparatus according to claim 1, wherein a distance in the up-down direction between said first surface and said lower surface of said substrate is greater than or equal to 0.6 mm and less than or equal to 1.5 mm.

* * * * *